United States Patent
Kimura et al.

(10) Patent No.: US 10,633,764 B2
(45) Date of Patent: Apr. 28, 2020

(54) GALLIUM NITRIDE CRYSTAL, ITS MANUFACTURING METHOD, AND CRYSTAL GROWTH APPARATUS

(71) Applicant: KABUSHIKI KAISHA TOYOTA CHUO KENKYUSHO, Nagakute-shi, Aichi-ken (JP)

(72) Inventors: Taishi Kimura, Nagakute (JP); Daisuke Nakamura, Nagakute (JP)

(73) Assignee: KABUSHIKI KAISHA TOYOTA JIDOSHA CHUO KENKYUSHO, Nagakute-shi (JP)

(*) Notice: Subject to any disclaimer, the term of this patent is extended or adjusted under 35 U.S.C. 154(b) by 0 days.

(21) Appl. No.: 15/578,192

(22) PCT Filed: Sep. 1, 2016

(86) PCT No.: PCT/JP2016/075644
§ 371 (c)(1),
(2) Date: Nov. 29, 2017

(87) PCT Pub. No.: WO2017/043411
PCT Pub. Date: Mar. 16, 2017

(65) Prior Publication Data
US 2018/0291525 A1 Oct. 11, 2018

(30) Foreign Application Priority Data
Sep. 8, 2015 (JP) .................. 2015-176541

(51) Int. Cl.
*C30B 25/14* (2006.01)
*C23C 16/34* (2006.01)
(Continued)

(52) U.S. Cl.
CPC .......... *C30B 25/14* (2013.01); *C01B 21/0632* (2013.01); *C23C 16/34* (2013.01);
(Continued)

(58) Field of Classification Search
None
See application file for complete search history.

(56) References Cited

U.S. PATENT DOCUMENTS

2004/0000266 A1* 1/2004 D'Evelyn ............... B01J 3/062
117/2

FOREIGN PATENT DOCUMENTS

JP 2007-153664 A 6/2007
JP 2007-197302 A 8/2007
(Continued)

OTHER PUBLICATIONS

Washburn et al; (Formation Mechanism of Nanotubes in GaN; Physical Review Letters, vol. 79, No. 15, pp. 2835-2838; Oct. 13, 1997.*
(Continued)

*Primary Examiner* — Guinever S Gregorio
(74) *Attorney, Agent, or Firm* — Oliff PLC

(57) ABSTRACT

In a gallium nitride crystal, a nanovoid density in the crystal is less than $1\times10^5$ [cm$^{-2}$]. A crystal growth apparatus is an apparatus for manufacturing a gallium nitride crystal, wherein a member having a B concentration of less than 1 ppm at least at a surface part is used as a member used at a part where a temperature is 500° C. or higher (high-temperature member) among members exposed to a crystal growth space. When such a crystal growth apparatus is used, a gallium nitride crystal wherein a nanovoid density in the crystal is less than $1\times10^5$ [cm$^{-2}$] is obtained.

11 Claims, 4 Drawing Sheets

(51) Int. Cl.
  *C30B 25/08*  (2006.01)
  *C01B 21/06*  (2006.01)
  *C30B 29/40*  (2006.01)

(52) U.S. Cl.
  CPC ............ *C30B 25/08* (2013.01); *C30B 29/406* (2013.01); *C01P 2006/10* (2013.01); *C01P 2006/80* (2013.01)

(56) References Cited

FOREIGN PATENT DOCUMENTS

| JP | 2009-519202 A | 5/2009 |
|---|---|---|
| JP | 2012-248723 A | 12/2012 |
| JP | 2013-199412 A | 10/2013 |
| JP | 2013-227222 A | 11/2013 |
| JP | 2014-177362 A | 9/2014 |
| JP | 2015-71529 A | 4/2015 |

OTHER PUBLICATIONS

Pirouz; The Origins of Nanopipes and Micropipes in Non-Cubic GaN and SiC; Mat. Res. Soc. Symp. Proc. vol. 512; 1998.*

Z. Liliental-Weber et al; "Formation Mechanism of Nanotubes in GaN"; Physical Review Letters; vol. 79; No. 15; Oct. 13, 1997; pp. 2835-2838.

M.E. Hawkridge et al.; "Oxygen segregation to dislocations in GaN"; Applied Physics Letters; vol. 87; 2005; pp. 221903-1-221903-3.

W. Qian et al; "Open-core screw dislocations in GaN epilayers observed by scanning force microscopy and high-resolution transmission election microscopy"; Applied Physics Letters; vol. 67; No. 16; Oct. 16, 1995; pp. 2284-2286.

David Cherns et al; "Open core threading dislocations in GaN grown by hydride vapour phase epitaxy"; Philosophical Magazine; 2006; vol. 86 (29-31); pp. 4747-4756.

E. Richter et al; "GaN boules grown by high rate HVPE"; Physica Status Solidi C; vol. 8; No. 5; 2011; pp. 1450-1454.

D. Gogova et al; "Growth and Structual, optical and electrical properties study of bulk GaN"; Physica Status Solidi C; vol. 9; No. 3-4; 2012; pp. 1048-1052.

Kenji Fujito et al; "Bulk GaN crystals grown by HVPE"; Journal of Crystal Growth; vol. 311; 2009; pp. 3011-3014.

B. Schineller et al; "Vertical-HVPE as a Production Method for Free-Standing GaN-Substrates"; CS MANTECH Conference; May 14-17, 2007; pp. 123-126.

Oct. 11, 2016 International Search Report issued in Interntational Patent Application No. PCT/JP2016/075644.

Oct. 11, 2016 Written Opinion issued in International Patent Application No. PCT/JP2016/075644.

Sep. 26, 2017 Office Action issued in Japanese Patent Application No. 2015-176541.

Feb. 27, 2018 Office Action issued in Japanese Patent Application No. 2015-176541.

* cited by examiner

GALLIUM NITRIDE CRYSTAL, ITS MANUFACTURING METHOD, AND CRYSTAL GROWTH APPARATUS

FIELD OF THE INVENTION

The present invention relates to a gallium nitride crystal, a manufacturing method thereof, and a crystal growth apparatus, and more specifically to a gallium nitride crystal having few nanovoids, a manufacturing method thereof, and a crystal growth apparatus for manufacturing such a gallium nitride crystal.

BACKGROUND OF THE INVENTION

Gallium nitride (GaN) is a wide-gap semiconductor and is applied to an LED, a laser, a power semiconductor, an optical device, and others. A high-quality GaN crystal is required in order to manufacture a high-performance semiconductor device by using GaN.

Several methods have heretofore been used for growing a GaN crystal. For example, a molecular beam epitaxy (MBE) method and a metal organic chemical vapor deposition (MOCVD) method are used for growing a crystal up to several microns in thickness. Further, a hydride vapor phase epitaxial growth (HVPE) method and the like are used for growing a bulk GaN crystal exceeding ten microns in thickness.

In a bulk GaN crystal manufactured by an HVPE method or an epitaxially grown GaN crystal manufactured by an MBE method or an MOCVD method, however, the existence of a nanovoid is recognized (Non-patent Literatures 1 to 3). It has been reported that usually nanovoids of about $10^5$ to $10^7$ $cm^{-2}$ exist in a crystal, and a relevance with O impurity or an Si impurity (Non-patent Literatures 1 and 2) and a relevance with a screw dislocation (Non-patent Literature 3) have been pointed. A mechanism of forming a nanovoid, however, has not completely been clarified.

For example, Non-patent Literatures 1 and 2 disclose that:

(a) when an Si impurity concentration or an O impurity concentration increases, the phenomenon of increasing a nanovoid density is observed; and (b) on this occasion, obvious increase of dislocations is not recognized and hence an impurity relates to the formation of a nanovoid.

Meanwhile, Non-patent Literature 3 reports that a hollow screw dislocation exists in the center of a nanovoid, and a dislocation and a nanovoid relate to each other.

Non-patent Literatures 1 and 4 describe a relevance between a pit on a crystal surface (surface pit) and nanovoid forming. A nanovoid is thought to be formed from a surface pit, and hence a surface pit density is thought to have a strong correlation with a nanovoid density in a crystal. A surface pit, as described also in Non-patent Literature 5, causes various problems of making stable and long-time growth difficult while a bulk crystal grows, deteriorating crystallinity, and lowering a wafer processing yield. Further, when a power device is manufactured, an electric field concentrating part is generated from a surface pit as a starting point, and causes a withstand voltage to lower. Such surface pits therefore are required to be reduced to the greatest possible extent but an obvious countermeasure has not been clarified yet.

In an HVPE method or an MOCVD method, usually a member including a pBN coated graphite and a heater are used in a growth apparatus (Patent Literatures 1 and 2). A relevance between a B impurity derived from BN and a nanovoid, however, has not been known.

Patent Literature 3 describes that, when an impurity concentration is high, a crystal is likely to deform plastically and a crack is likely to be formed. As concrete substance names of impurities, however, only Mg, Fe, and the like are described and a B impurity is not referred to. Further, a relevance between an impurity and a defect such as a nanovoid has not been studied.

Further, in Patent Literature 4, there is a description of a defect called a "pipe hole" and a description that the density of "pipe holes" can be reduced to 300 pieces $cm^{-2}$. The "pipe hole" described in Patent Literature 4, however, is a hollow defect existing right under an etch pit in the manner of penetrating a crystal, and is a defect essentially different from a "nanovoid" formed intermittently right under a surface pit.

That is, as shown in FIG. 1 in Patent Literature 4, from the facts that a "pipe hole" penetrates a crystal and a pit is formed by etching, a factor of forming a "pipe hole" is suspected not to be an impurity but to be a dislocation such as a hollow screw dislocation.

Moreover, Patent Literature 4 describes that "in the observation of a pipe hole, a large pit recognizable by an optical microscope is formed by etching a crystal with an acid or alkali solution". On the other hand, when a crystal including a surface pit and a nanovoid is etched, the surface pit right above the nanovoid disappears by the etching and cannot be observed.

CITATION LIST

Patent Literature

[Patent Literature 1] Japanese Unexamined Patent Application Publication No. 2015-071529
[Patent Literature 2] Japanese Unexamined Patent Application Publication No. 2014-177362
[Patent Literature 3] Japanese Unexamined Patent Application Publication No. 2013-227222
[Patent Literature 4] Japanese Unexamined Patent Application Publication No. 2012-248723

Non-Patent Literature

[Non-patent Literature 1] Z. Liliental-Weber et al., Phys. Rev. Lett. 79, 2835 (1997)
[Non-patent Literature 2] M. E. Hawkridge et al., Appl. Phys. Lett. 87, 221903 (2005)
[Non-patent Literature 3] W. Qian et al., Appl. Phys. Lett. 67, 2284 (1995)
[Non-patent Literature 4] D. Cherns et al., Philosophical Magazine 86, 4747 (2006)
[Non-patent Literature 5] E. Richter et al., Phys. Status Solidi C8, 1450 (2011)

SUMMARY OF THE INVENTION

A problem to be solved by the present invention is to provide a novel gallium nitride crystal having fewer nanovoids than a conventional crystal.

Further, other problems to be solved by the present invention are to provide a crystal growth apparatus capable of manufacturing such a gallium nitride crystal and a method of manufacturing a gallium nitride crystal by using the apparatus.

The gallium nitride crystal according to the present invention is, in order to solve the above problems, a gallium nitride crystal wherein a nanovoid density in the crystal is less than $1\times10^5$ [cm$^{-2}$].

The crystal growth apparatus according to the present invention is a crystal growth apparatus for manufacturing a gallium nitride crystal according to the present invention, wherein the apparatus uses a member having a B concentration of less than 1 ppm at least at a surface part as a member used at a part where a temperature is 500° C. or higher (high-temperature member) among members exposed to a crystal growth space.

Further, the method of manufacturing the gallium nitride crystal according to the present invention is a method of manufacturing the gallium nitride crystal with a crystal growth apparatus according to the present invention.

In the growth of a gallium nitride crystal, usually the crystal grows in a direction perpendicular to a c-plane ({0001} plane) that is a stable plane. Meanwhile, a B impurity existing in a system segregates at the surface of a GaN crystal and changes surface energy. As a result, over a growth plane where a B impurity segregates, not a c-plane but a high-index plane (a semi-polar plane or a non-polar plane) stabilizes. The high-index plane appearing over the growth plane is estimated to cause a nanovoid to be generated.

In contrast, by using a member having a B concentration of less than 1 ppm at least at a surface part as a high-temperature member, it is possible to inhibit a B impurity from segregating over the growth plane of a GaN crystal, and a high-index plane caused by the segregation from being generated. As a result, a GaN crystal having a nanovoid density lower than a conventional crystal is obtained.

DETAILED DESCRIPTION OF THE PREFERRED EMBODIMENTS

An embodiment according to the present invention is hereunder explained in detail.

[1. Gallium Nitride Crystal]

A gallium nitride crystal according to the present invention is characterized in that a nanovoid density in the crystal is less than $1\times10^5$ [cm$^{-2}$].

[1.1. Nanovoid]

[1.1.1. Definition]

In the present invention, a "nanovoid" is a hollow defect extending in a c-axis direction and means a void having a radius of 1 nm to 500 nm, a length of 1 nm to 1,000 nm, and an aspect ratio of 50 or less. A nanovoid is a region where GaN does not exist and is a discontinuous region where periodicity of a crystal does not exist in a GaN crystal.

A nanovoid is thought to be generated from the results that:

(a) a B impurity segregates over a growth plane including a c-plane (polar plane) and thus a high-index plane (a semi-polar plane) appears partially over the growth plane;

(b) a new crystal does not grow substantially over the high-index plane and a new crystal grows preferentially over the c-plane, and hence a hollow defect is generated right above the high-index plane; and (c) at a time when the hollow defect grows to some extent, the upper part of the hollow defect plugs by the fluctuation of an impurity flux and the like.

The aspect ratio of a nanovoid therefore is 50 or less. Further, during a growth process, since the generation of a high-index plane and the plug of a hollow defect are repeated, a nanovoid appears intermittently right under a surface pit. Even when an aspect ratio is 50 or less, an electric field concentration occurs in the nanovoid site, causing problems such as an increase in a leakage current.

Figure 1:
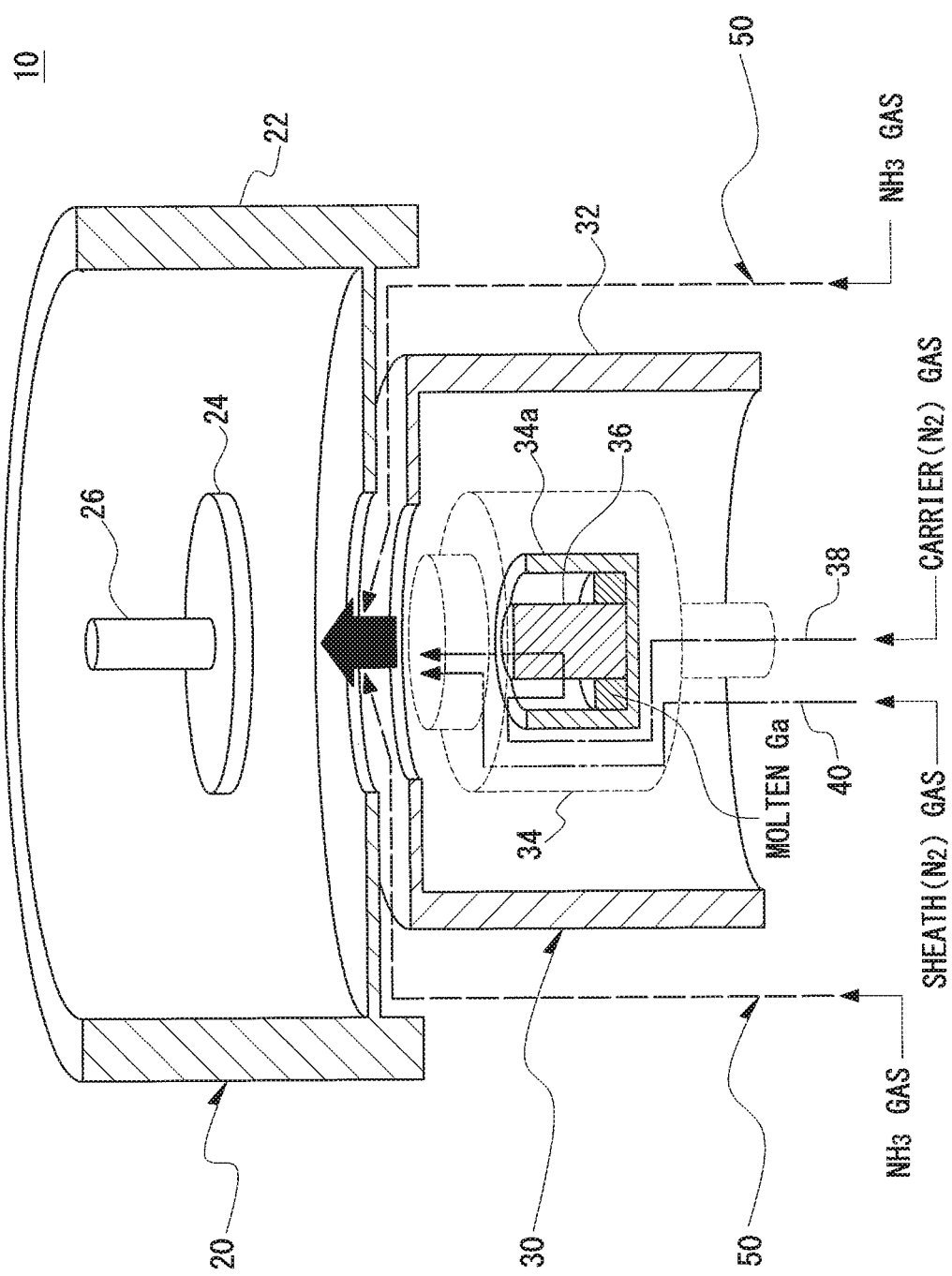
FIG. 1 is a schematic sectional view of a crystal growth apparatus according to the present invention.

Meanwhile, a "pipe hole" disclosed in Patent Literature 4 has an aspect ratio of 70 or more (refer to FIG. 1 in Patent Literature 4). Such a "pipe hole" is thought to be a defect caused by a dislocation and comes to be a large pit recognizable by etching with an optical microscope or the like. In contrast, a "nanovoid" cited in the present application is not a defect caused by a dislocation, but is a defect caused by the stabilization of a semi-polar plane formed by a B impurity. Therefore, a nanovoid is essentially different from a "pipe hole".

[1.1.2. Nanovoid Density]

A nanovoid density can be calculated by using sectional TEM observation. When the thickness of a specimen (in a depth direction from a paper surface) is about 100 nm, the observation is performed along a c-axis direction by sectional TEM observation. An arbitrary region of several tens of nanometers is selected in a c-axis direction of a crystal in a visual field (for example, 500 nm in lateral direction×500 nm in longitudinal direction (c-axis direction)). When one nanovoid is observed in the visual field, a nanovoid density in the visual field (hereunder, also referred to as a "visual field density") is calculated roughly as $2\times10^9$ [cm$^{-2}$]. From the average value of visual field densities observed in several visual fields in this way, a nanovoid density can be calculated.

A nanovoid density of a gallium nitride crystal according to the present invention is less than $1\times10^5$ [cm$^{-2}$]. This requirement can be attained by a method to be described later. A nanovoid density is preferably more than 0 to less than $1\times10^5$ [cm$^{-2}$] and more preferably $1\times10^4$ [cm$^{-2}$] or more to less than $1\times10^5$ [cm$^{-2}$]. A nanovoid density is less than $1\times10^4$ [cm$^{-2}$] when manufacturing conditions are further optimized.

[1.2. Surface Pit]

[1.2.1. Definition]

A "surface pit" means a pit appearing over a growth plane immediately after growth by segregating a B impurity over the growth plane and stabilizing a semi-polar plane of GaN. A surface pit is different from a pit appearing by etching a planar growth plane, namely an etch pit.

[1.2.2. Surface Pit Density]

A mechanism of forming a surface pit is different from that of an etch pit. Consequently, as described in Patent Literature 4, a surface pit density cannot be measured accurately by a method of etching a gallium nitride crystal with an acid or alkali solution for example. A nanovoid appears intermittently right under a pit (about 4 nm in average radius) existing over the surface of a crystal immediately after growth. The formation of the pit is due to the stabilization of a semi-polar plane formed by a B impurity.

Consequently, when a crystal surface immediately after growth is etched, a c-plane as an ordinary stable plane is etched first and a surface pit disappears.

A surface pit density therefore has to be estimated statistically by using the following method while observing a crystal surface immediately after growth with a scanning electron microscope (SEM) or an atomic force microscope (AFM) without etching the crystal surface.

Here, a wafer of a 2-inch (5.08 cm) size is used as an example. Further, since a surface pit appears at random in a plane by the segregation of a B impurity, it is assumed that there is no in-plane distribution (namely, a surface pit density in a plane is equivalent).

(1) The surface of a wafer is partitioned into dice-shaped areas of 10 mm square each (measurement areas). For example, in the case of a 2-inch wafer, nine measurement areas are formed. Here, remaining deficient areas smaller than 10 mm square are excluded from the measurement areas.

(2) The surfaces of the measurement areas are observed with an SEM or the like. The size of the measurement areas is set at 5 μm×7 μm. Further, at each of the measurement areas, arbitrarily selected 11 visual fields are observed respectively with an SEM or the like and the number of surface pits is measured in each of the visual fields.

(3) An average value in the all visual fields is obtained by dividing the total number of surface pits appearing in the respective visual fields by the total area of the respective visual fields and is defined as a "surface pit density".

For example, it means that, in the case of a wafer 2 inches in size, 99 visual fields in total are observed with an SEM or the like. If one surface pit is assumed to be observed only in one visual field among the 99 visual fields, the number of surface pits per unit area in the visual field (hereunder referred to as a "surface pit density per one visual field") corresponds to $2.9 \times 10^6$ [cm$^{-2}$]. Further, an average value in the all visual fields is $2.9 \times 10^4$ [cm$^{-2}$].

Assuming normality in the distribution of a surface pit density per one visual field, an average value of surface pit densities per one visual field (namely a surface pit density) exists in the range of 0 or more to $8.6 \times 10^4$ [cm$^{-2}$] or less at a 95% confidence interval.

In this way, an average value of the all visual fields (namely a surface pit density) and a 95% confidence interval can be obtained.

Here, a 95% confidence interval can be calculated through the following expression.

95% confidence interval=$m \pm 1.96 \times \sigma$ where m represents an average value of surface pit densities per one visual field, and σ represents a standard deviation of surface pit densities per one visual field.

[1.2.3. Relationship Between Nanovoid Density and Surface Pit Density]

There is a strong correlation between a nanovoid density and a surface pit density in a crystal, and they show nearly equivalent values. This is presumably because a nanovoid in a crystal is formed from a surface pit over a growth plane. By calculating a surface pit density with an AFM, an SEM, or the like therefore, a nanovoid density in a crystal can be grasped.

[1.3. B Impurity]

B has the function of stabilizing a semi-polar plane of GaN. Consequently, there is a strong correlation between a nanovoid density and a B impurity concentration in a crystal. In order to control a nanovoid density to less than $1 \times 10^5$ [cm$^{-2}$], a B impurity concentration in a crystal is controlled preferably to $3 \times 10^{16}$ [cm$^{-3}$] or less and more preferably to $1 \times 10^{16}$ [cm$^{-3}$] or less. Further, it is estimated that a crystal not having a nanovoid and a surface pit can be manufactured if a B impurity concentration can be reduced to about $1 \times 10^{14}$ [cm$^{-3}$].

A B impurity concentration (and other impurity concentrations that will be described later) in a crystal can be measured by secondary ion mass spectrometry (D-SIMS) or the like for example. For example, SIMS analysis is applied to the thickness of 3 μm in the depth direction at a certain point of a grown crystal. The thickness of about 100 nm in the depth direction from the surface is excluded because it is influenced by surface contamination, and an average impurity concentration from 100 nm to 3 μm in depth is calculated.

[1.4. Other Impurities]

Depending on the manufacturing methods of a GaN crystal, impurities other than B may sometimes intrude into a crystal. Among those impurities, some impurities do not have the function of stabilizing the semi-polar plane of GaN (namely the function of increasing a nanovoid density) but have the function of lowering a device characteristic. Such impurities should be reduced to the greatest possible extent in order to obtain a high-performance device.

For example, when an alkali metal such as Na or K is included in a GaN crystal, the alkali metal becomes a movable ion in an oxide film in a device process as it is well-known in a silicon process. This causes the problems such as destabilization of a threshold value.

Further, when a crystal including a movable ion is handled, because of the problems such as cross-contamination, an existing Si process line cannot be used and an exclusive process line has to be built. As a result, manufacturing cost increases substantially.

Likewise, also a heavy metal such as Ni or Cr forms a deep level in the case of an Si device and hence the increase of a leakage current is concerned. As a result, when a crystal including a heavy metal and a crystal not including a heavy metal are handled, an identical line cannot be used.

Consequently, a movable ion (Na impurity or K impurity) and a heavy metal (Ni impurity or Cr impurity) are each preferably $1 \times 10^{14}$ [cm$^{-3}$] or less, which is a detection limit.

Among crystal growth apparatuses according to the present invention to be described later, an apparatus using a halogen-free VPE method can manufacture a GaN crystal substantially not containing a movable ion such as Na or K and a heavy metal such as Ni or Cr. Consequently, a device process using such a crystal is not likely to cause a problem of cross-contamination, can use an existing process, and has advantages in the cost and the stability of quality.

[1.5. Application]

The GaN crystal according to the present invention, for example, can be used for manufacturing a Schottky barrier (SB) diode, a PN diode, a high electron mobility transistor (HEMT) structure, a metal-oxide-semiconductor (MOS) structure, or a junction field effect transistor (JFET) structure, and for manufacturing a power device using those. The GaN crystal according to the present invention has relatively small numbers of nanovoids and surface pits. Therefore, the use of such a GaN crystal makes it possible to manufacture a power device having a high withstand voltage and low on-resistance, namely a power device showing a characteristic close to a trade-off relationship between a withstand voltage and on-resistance of an ideal GaN crystal.

Further, the GaN crystal according to the present invention, for example, has few defects to generate non-radiative recombination and hence an optical device using the GaN crystal shows high efficiency.

Furthermore, a high-quality lengthy GaN crystal can grow easily when a method to be described later is used. As a result, the method makes it possible to easily manufacture not only a GaN substrate growing over a c-plane that is a polar plane, but also a GaN substrate growing over an m-plane ({1-100} plane) or an a-plane ({11-20} plane), or an m-plane substrate and an a-plane substrate that are cutout from a lengthy c-plane grown crystal. A highly efficient optical device or the like can be manufactured by using a GaN wafer having a surface of a non-polar plane such as an m-plane or an a-plane.

[2. Crystal Growth Apparatus]

The crystal growth apparatus according to the present invention is a crystal growth apparatus for manufacturing the gallium nitride crystal according to the present invention, wherein the apparatus uses a member having a B concentration of less than 1 ppm at least at a surface part as a member used at a part where a temperature is 500° C. or higher (high-temperature member) among members exposed to a crystal growth space.

[2.1. High-Temperature Member]

[2.1.1. Definition]

A "high-temperature member" means a member used at a part where a temperature is 500° C. or higher among members exposed to a crystal growth space.

As high-temperature members which are likely to be contamination sources of a B impurity in particular, examples include:

(a) a holder for retaining a substrate for growing a GaN crystal;

(b) a crucible for retaining a Ga source (molten Ga);

(c) a heater for heating a Ga source to a predetermined temperature;

(d) a heat insulator for maintaining a Ga source and a substrate at predetermined temperatures;

(e) a device member such as a container with gas hole for mixing a carrier gas, a sheath gas, and a reaction gas at an appropriate position in an apparatus; and (f) a screw member used for fixing a device member.

[2.1.2. Material]

As stated earlier, a surface pit and a nanovoid formed right under the surface pit are generated by the segregation of a B impurity over a growth plane. This point is knowledge found newly by the present inventors and there has not heretofore been a case of focusing attention on a high-temperature member that comes to be a B impurity source in order to reduce nanovoids.

A B concentration in a high-temperature member is required to be reduced to the greatest possible extent in order to inhibit a nanovoid from being generated. In order to obtain a GaN crystal having a nanovoid density of less than $1 \times 10^5$ [cm$^{-2}$], a high-temperature member has preferably a B concentration of less than 1 ppm at least at a surface part.

Here, a "surface part" means a region from a surface to the depth of 50 μm.

Usually, a GaN crystal grows under a high-temperature reducing atmosphere using an ammonia gas or the like. A material that is durable under a high-temperature reducing atmosphere is limited. Normally, a pBN coated graphite member, a graphite member, a graphite heat insulator and the like have been used frequently as high-temperature members. Among those members, a pBN coated graphite member is highly durable under a high-temperature reducing atmosphere but comes to be a main contamination source of a B impurity to a crystal. For this reason, in order to reduce a nanovoid density, a pBN coated member such as a pBN coated graphite member is preferably not used as a high-temperature member.

As preferred high-temperature members in the present application, examples include:

(a) a TaC coated member such as a TaC coated graphite member;

(b) an SiC coated member such as an SiC coated graphite member;

(c) a bulk member comprising TaC; and (d) a bulk member comprising SiC.

A B concentration in TaC or SiC constituting a surface part is usually less than 1 ppm and hence TaC or SiC does not become a contamination source of a B impurity.

Further, some types of graphite members and graphite heat insulators may sometimes contain a trifle amount of B. A trifle amount of B also becomes a contamination source of a B impurity into a crystal. Even in the case of a graphite member containing a trifle amount of B, however, when it is subjected to heat treatment at a temperature of 2,000° C. or more under a non-oxidizing atmosphere, a B concentration can be less than 1 ppm (high-purity processing). For this reason, a high-temperature member may also be an uncoated graphite member which is subjected to high-purity processing so that a B concentration may be less than 1 ppm.

Among those members, a TaC coated member is highly durable under a high-temperature reducing atmosphere, reduces the contamination of a B impurity into a crystal, moreover makes it easy to manufacture a member of an arbitrary shape, and hence is suitable particularly as a high-temperature member.

[2.2. Growth Unit]

In the crystal growth apparatus according to the present invention, a unit that grows a GaN crystal is not particularly limited. Growth units include:

(a) a unit of using a vapor phase epitaxial growth method not using halogen (halogen-free VPE method);

(b) a unit of using a metal organic chemical vapor deposition (MOCVD) method;

(c) a unit of using a hydride vapor phase epitaxial growth (HYPE) method;

(d) a unit of using a molecular beam epitaxy (MBE) method;

(e) a unit of using an Na flux method that is a liquid phase growth method;

(f) a unit of using a high pressure method; and (g) a unit of using an ammonothermal method.

Here, a "halogen-free VPE method" means a method of supplying Ga vapor and an NH$_3$ gas to a substrate surface, reacting them, and growing a GaN crystal over the substrate surface.

An "MOCVD method" means a method of supplying an organometallic compound such as trimethylgallium and an NH$_3$ gas to a substrate surface, reacting them, and growing a GaN crystal over the substrate surface.

An "HVPE method" means a method of supplying gallium chloride and an NH$_3$ gas to a substrate surface, reacting them, and growing a GaN crystal over the substrate surface.

An "MBE method" means a method of vaporizing Ga as a raw material under ultrahigh vacuum, reacting Ga with nitrogen plasma or the like, and growing a GaN crystal.

An "Na flux method" means a method of bringing a mixed melt of metallic Ga and metallic Na heated to about 800° C. into contact with nitrogen pressurized to several MPa, thus dissolving the nitrogen into the mixed melt, and growing a GaN crystal in a liquid phase.

A "high pressure method" means a method of dissolving nitrogen into Ga in a high-temperature high-pressure state of several GPa and a temperature of 1,500° C. or more, cooling them slowly, and growing a GaN crystal.

An "ammonothermal method" means a method of dissolving a GaN raw material into supercritical or subcritical (a temperature of about 500° C. and a pressure of about 0.1 GPa) $NH_3$, and thus growing a GaN crystal by recrystallization.

Among those units, a unit using a halogen-free VPE method, an MOCVD method, or an HVPE method does not require a high pressure condition and hence an apparatus can be manufactured at a comparatively low cost. Further, because of a vapor phase growth method, a growth rate is higher than that of a liquid phase growth method stated above (except an MBE method). For example, by a halogen-free VPE method or an HVPE method, a GaN crystal can grow at a growth rate of several hundred μm/h or higher. Furthermore, those methods are suitable for the growth of a large-diameter crystal. Consequently, those methods are suitable as growth units.

Moreover, a unit of using a halogen-free VPE method makes high-speed growth and long-term growth possible, and can obtain a crystal not substantially containing a movable ion and a heavy metal. Therefore, the unit is particularly suitable as a growth unit in comparison with a unit of using another method.

[2.3. Concrete Example of Crystal Growth Apparatus]

FIG. 1 shows a schematic sectional view of a crystal growth apparatus according to the present invention. A crystal growth apparatus shown in FIG. 1 is an apparatus having a growth unit of growing a gallium nitride crystal by using a halogen-free VPE method (hereunder referred to as a "halogen-free VPE apparatus").

In FIG. 1, a halogen-free VPE apparatus 10 includes a crystal growth section 20, a Ga vapor generation section 30, and a reaction gas supply unit 50.

[2.3.1. Crystal Growth Section]

The crystal growth section 20 includes a first reaction tube 22 and a holder 26 for retaining a substrate 24. The substrate 24 is a seed crystal for growing a gallium nitride crystal over the top plane. The holder 26 is connected to the bottom plane (the plane opposite to the growth plane) of the substrate 24. The holder 26 is installed nearly in the center of the first reaction tube 22.

An opening is formed at the lower part of the first reaction tube 22 so that raw material gases supplied from the Ga vapor generation section 30 and the reaction gas supply unit 50 may be supplied to the top plane of the substrate 24. Further, the substrate 24 is fixed over a heating susceptor pedestal (not shown in the figure) so as to be heated to a predetermined temperature by the heating susceptor.

A material having high thermal resistance and low reactivity with the raw material gases (for example, quartz or the like) is used for the first reaction tube 22.

A sapphire substrate is usually used for the substrate 24. The substrate 24 is preferably cleaned before crystal growth in order to remove impurities and the like. As cleaning methods for example, callous washing, RCA cleaning, and organic cleaning are named.

The holder 26 may possibly be a contamination source of a B impurity and hence a TaC coated graphite member is used for the holder 26.

[2.3.2. Ga Vapor Generation Section]

The Ga vapor generation section 30 is for supplying Ga vapor toward the substrate 24, and includes a second reaction tube 32 and a triple crucible 34. The triple crucible 34 is installed nearly in the center of the second reaction tube 32. The triple crucible 34 can be heated to a predetermined temperature by a heater (not shown in the figure) installed outside the second reaction tube 32.

An opening is formed at the upper part of the second reaction tube 32 so that Ga vapor supplied from the triple crucible 34 may be supplied to the first reaction tube 22.

The triple crucible 34 is configured so as to be able to feed a carrier gas and a sheath gas independently into the interior. A crucible 34a located at the innermost of the triple crucible 34 is a crucible for retaining molten Ga. The shape and size of the crucible 34a are not particularly limited and optimum shape and size can be selected in accordance with the intended use.

An evaporator 36 is installed in the crucible 34a. The evaporator 36 may be installed so that a part of it can touch the molten Ga. For example, the evaporator 36 may be fixed to the bottom face of the crucible 34a or may be in the state of merely floating on the surface of the molten Ga.

The evaporator 36 is a device for accelerating the generation of Ga vapor from the molten Ga in the crucible 34a. When a part of the evaporator 36 touches the molten Ga, the molten Ga creeps up along the surface of the evaporator 36 and wets the surface of the evaporator 36. When the molten Ga wets the surface of the evaporator 36, the apparent surface area of the molten Ga increases. As a result, the supply rate of Ga vapor increases in comparison with the case of not using an evaporator 36. More specifically, by using the evaporator 36, the evaporation quantity of Ga vapor can be increased by one order of magnitude or more.

A flow channel (not shown in the figure) for feeding a carrier gas is formed between the crucible 34a located at the innermost and an intermediate crucible (not shown in the figure). The flow channel is connected to a carrier gas supply source (not shown in the figure) at the exterior (a carrier gas supply unit 38). The carrier gas supply unit 38 is a unit for feeding a carrier gas into the crucible 34a and thus accelerating the supply of Ga vapor from the crucible 34a to the substrate 24. The carrier gas is not particularly limited and usually an $N_2$ gas is used.

A flow channel (not shown in the figure) for feeding a sheath gas is formed between the intermediate crucible (not shown in the figure) and an outermost crucible (not shown in the figure). The flow channel is connected to a sheath gas supply source (not shown in the figure) at the exterior (a sheath gas supply unit 40). The sheath gas supply unit 40 is a unit for feeding a sheath gas between a carrier gas and a reaction gas which are supplied toward the substrate 24 and thus inhibiting the reaction gas from intruding into the crucible 34a. The sheath gas is not particularly limited and usually an $N_2$ gas is used.

A material having high thermal resistance and low reactivity with the raw material gases (for example, quartz or the like) is used for the second reaction tube 32. Since the triple crucible 34 can be a contamination source of a B impurity, a TaC coated graphite member is used for the triple crucible 34. For the crucible 34a to retain molten Ga, however, a member including a material with not only low content of a B impurity but also less creep-up height of molten Ga (for example graphite) is used preferably.

A material allowing molten Ga to creep up the surface is used for the evaporator 36. In order to increase a creep-up height of molten Ga, the material for the evaporator 36 is preferably a material having a relative density of 40% or more to 99% or less, an average pore diameter of 10 nm or more to 200 μm or less, and a contact angle to molten Ga of less than 90°. As materials satisfying such conditions for example, TaC, SiC, $Al_2O_3$, and others are named. In particular, TaC has a larger creep-up height of molten Ga than other materials and hence is suitable as a material for the evaporator 36.

[2.3.3. Reaction Gas Supply Unit]

A flow channel (not shown in the figure) for feeding a reaction gas is formed outside the second reaction tube 32. The flow channel is connected to a reaction gas supply source (not shown in the figure) at the exterior (a reaction gas supply unit 50). The reaction gas supply unit 50 is a unit for supplying a reaction gas for reacting with Ga vapor toward the substrate 24. The reaction gas passes through the outside of the second reaction tube 32 and is supplied to an opening formed at the lower part of the first reaction tube 22. The reaction gas is not particularly limited and usually an $NH_3$ gas diluted by an $N_2$ gas is used.

[3. Manufacturing Method of Gallium Nitride Crystal]

The manufacturing method of a gallium nitride crystal according to the present invention is characterized by manufacturing the gallium nitride crystal by using the crystal growth apparatus according to the present invention. A method of manufacturing a gallium nitride crystal with a halogen-free VPE apparatus 10 is explained hereunder.

Firstly, a substrate 24 is connected to a tip of a holder 26 and is fixed over a heating susceptor pedestal. Successively, the substrate 24 is heated to a predetermined temperature with a heating susceptor.

Successively, a predetermined quantity of metallic Ga is inserted into a crucible 34a in which an evaporator 36 is installed and the metallic Ga is melted. Successively, a carrier gas is fed into the crucible 34a by a carrier gas supply unit 38 and a sheath gas is fed to the vicinity of an opening of the crucible 34a by a sheath gas supply unit 40. Further, at the same time with this, a reaction gas is fed to a crystal growth section 20 by a reaction gas supply unit 50. As a result, the carrier gas containing Ga vapor and the reaction gas can be supplied to the crystal growth section 20 while the sheath gas prevents the reaction gas from intruding into the crucible 34a.

When the Ga vapor and the reaction gas are supplied to the crystal growth section 20, they react with each other in the vicinity of the surface of the substrate 24 and GaN precipitates over the surface of the substrate 24.

Since the temperature of the crucible 34a is high, when the reaction gas intrudes into the crucible 34a during the generation of the Ga vapor, synthesis and decomposition of GaN occur in the crucible 34a. As a result, the bumping of liquid Ga and the like are generated and not only the Ga vapor but also Ga droplet is supplied to the crystal growth section. The Ga droplet causes therefore polycrystalline GaN to grow undesirably at the crystal growth section. Consequently, there are the problems of not only making stable crystal growth impossible but also polycrystallizing a growth crystal and deteriorating crystal quality considerably.

In contrast, a halogen-free VPE apparatus 10 shown in FIG. 1 uses a triple crucible 34 allowing a sheath gas to flow and hence can prevent a reaction gas from intruding into a crucible 34a. As a result, Ga vapor can be generated stably without generating GaN in the crucible 34a.

Further, a halogen-free VPE apparatus 10 shown in FIG. 1 uses an evaporator 36 and hence can increase the quantity of Ga vapor and a growth rate. It is confirmed that a growth rate is 700 μm/h or more when an $N_2$ gas is used as a carrier gas. Furthermore, when the halogen-free VPE apparatus 10 is used, such high-speed growth can continue for 100 hours or longer.

Reference 1 discloses a structure that is similar to the crystal growth apparatus according to the present invention and is configured so that a Ga supply section and a reaction section may be split into two sections. A halogen-free VPE apparatus 10 according to the present invention, however, has a simpler structure and a larger degree of freedom.

Further, by using a halogen-free VPE apparatus 10, the quantity of supplied Ga can be increased without using an HCl gas. As a result, there is no problem of clogging a pipe by $NH_4Cl$, which has heretofore been a problem of an HVPE method (References 2 and 3). Furthermore, a member is inhibited from being corroded by a chlorine-based gas and hence a crystal of a large diameter can grow at a low cost for a long period of time.

[Reference 1] D. Gogova et al., Phys. Status Solidi C9, 1048 (2012)

[Reference 2] K. Fujito et al., J. Crist. Growth 311, 3011 (2009)

[Reference 3] B. Schineller et al., CS MANTEC Conference (2007)

[4. Effect]

Although it has heretofore been known that a nanovoid exists in a GaN crystal, the mechanism of forming it has not completely been clarified yet. Because there has not been knowledge on the relationship between a B impurity and a defect in a GaN crystal in particular, a B impurity has intruded into a growth crystal from a member for crystal growth. As a result, nanovoids and surface pits of certain densities have been formed in a growth crystal, new nucleation has been accelerated over a growth plane, and the improvement of crystal quality has been hindered.

Existence of a large crystal defect such as a nanovoid in a crystal causes a withstand voltage to lower during the manufacturing of a power device for example. Further, an optical characteristic is caused to deteriorate when an optical device is manufactured. A surface pit also causes a yield to lower during the processing of a wafer and a withstand voltage to lower by electric field concentration. For the reason, the reduction of a nanovoid density and a surface pit density in a GaN crystal is indispensable for manufacturing a high-performance device.

Non-patent Literature 1 reports the existence of nanovoids at a density of about $10^5$ to $10^7$ $cm^{-2}$ but does not describe a method for obtaining an accurate nanovoid density. A nanovoid density is thought to be judged presumably by the density of nanovoids observed in a sectional TEM image. When a nanovoid density is low, however, only local information is obtained from a sectional TEM image and hence a nanovoid density cannot be measured quantitatively and accurately. Further, since a nanovoid is not related to a dislocation, the density cannot be obtained from a rocking curve measurement result of XRD. There is therefore a possibility that a nanovoid density is larger than a value described in Non-patent Literature 1.

A B impurity segregates over the surface of a GaN crystal and changes surface energy. As a result, not a c-plane usually used for crystal growth but another crystal plane is stabilized and a high-index plane is likely to appear during growth. Further, by changing interface energy, new nucleation is accelerated over a growth plane. Those points are clarified through experiments by the present inventors.

A B impurity that causes these problems is discharged from a member composed of a pBN coated graphite, a heater, a graphite heat insulator and the like. The influence of a B impurity on crystal quality has been unclear, however, and hence a B impurity has heretofore not drawn attention and no countermeasures have been taken.

When a crystal plane is destabilized for example, not a c-plane but a high-index plane is stabilized and hence many pits are formed over a crystal surface during the manufacturing of a bulk crystal. By such stabilization of a high-index plane in this way, not only continuous bulk crystal growth becomes difficult but also the problems of roughening a surface, lowering a yield when a seed crystal is extracted, and deteriorating crystallinity are caused. For the reason, those phenomena have to be prevented.

Further, when many novel nuclei are formed for example, orientations of the new crystal nuclei deviate slightly and a dislocation is generated during nuclear coalescence. Consequently, the crystallinity of a growth crystal lowers. When many nuclei are generated during crystal growth, a high-quality crystal hardly grows and hence that has to be prevented.

Moreover, a nanovoid in a crystal is a crystal defect of a large scale even in comparison with a point defect and a liner defect. Therefore, the nanovoid causes the optical characteristic of the crystal to deteriorate and the withstand voltage to lower during device manufacturing. For the reason, a nanovoid density has to be as close to zero as possible.

In contrast, when a GaN crystal grows in an environment of reducing a B impurity or an environment of not containing a B impurity, it is possible to stabilize a usually-used crystal growth plane (c-plane or –c-plane) and inhibit excessive nuclei from forming. Further, it is possible to reduce the density of nanovoids in a crystal and the density of surface pits on a crystal surface, which are formed by the segregation of a B impurity. As a result, a very high-quality (a nanovoid density of less than $1 \times 10^5$ [cm$^{-2}$]) crystal, in comparison with a GaN crystal that has heretofore been manufactured, can be manufactured.

Through experiments and studies by the present inventors, it is clarified in GaN crystal growth that:

(a) a B impurity changes the surface energy of a crystal surface; and (b) the foregoing (a) influences the destabilization of a specific crystal plane (c-plane or the like), the acceleration of novel nucleation, the acceleration of nanovoid forming in a growth crystal, the acceleration of pit forming over a growth crystal surface, and the like.

As a result, by growing a GaN crystal in an environment of reducing a B impurity or an environment of not containing a B impurity, it is possible to inhibit such phenomena as described above from occurring and grow a high-quality GaN crystal easily.

EXAMPLE

Example 1 and Comparative Example 1

1. Manufacturing of Specimen 1.1. Example 1

A GaN crystal of 50 μm in thickness was grown by using a halogen-free VPE apparatus 10 shown in FIG. 1. A sapphire substrate was used as a substrate 24. The sapphire substrate was subjected to callous washing beforehand in order to remove impurities and others over the surface. Further, metallic Ga and a TaC-made evaporator 36 were arranged in a crucible 34*a*.

The substrate 24 was fixed onto a heating susceptor pedestal and heated to 1,100° C. in the apparatus. The temperature of the crucible 34*a* was set at 1,250° C. and the pressures in a first reaction tube 22 and a second reaction tube 32 were set at 1 to 100 kPa. The flow rate of NH$_3$ supplied from a reaction gas supply unit 50 was set at 1 to 10 slm and the flow rate of N$_2$ for diluting NH$_3$ was set at 1 to 20 slm. Further, a carrier gas (N$_2$) flow rate was set at 2 slm and a sheath gas (N$_2$) flow rate was set at 5 slm.

Furthermore, a TaC coated graphite member was used for a holder 26. A graphite subjected to high-purity processing was used for the crucible 34*a* to retain molten Ga in a triple crucible 34 and a TaC coated graphite was used for the rest. Moreover, a graphite heat insulator obtained by reducing a B impurity concentration through high-purity processing was used as a heat insulator.

1.2. Comparative Example 1

A GaN crystal of 50 μm in thickness was grown in the same manner as Example 1 except that a pBN coated graphite crucible was used as a crucible 34*a*.

2. Result 2.1. Growth Rate

In the case of crucible temperature: 1,250° C., susceptor temperature: 1,100° C., pressure in reaction tube: 4 kPa, NH$_3$ flow rate: 3 slm, N$_2$ flow rate for diluting NH$_3$: 2 slm, carrier gas flow rate: 2 slm, and sheath gas flow rate: 5 slm, the growth rate of about 300 μm/h was obtained.

2.2. Morphology of Growth Crystal

The morphology of a crystal was considerably different by changing the material of a crucible 34*a* in spite of the fact that the conditions were identical except that the material of the crucible 34*a* was different. In a crystal manufactured by using a pBN coated graphite crucible, many hexagonal hillocks were formed over the surface. This is thought to be caused by the fact that a crystal surface is formed by a plane other than a c-plane due to the stabilization of a high-index plane and that novel nucleation occurs frequently.

On the other hand, in a crystal manufactured by using a graphite crucible subjected to high-purity processing, a c-plane growth was dominant and a new nucleation part was not confirmed. It has been clarified that a c-plane growth can be carried out stably for a long period of time by using a TaC coated graphite crucible not containing a B impurity in this way.

2.3. Surface Pit Density and Nanovoid Density

Figure 2:
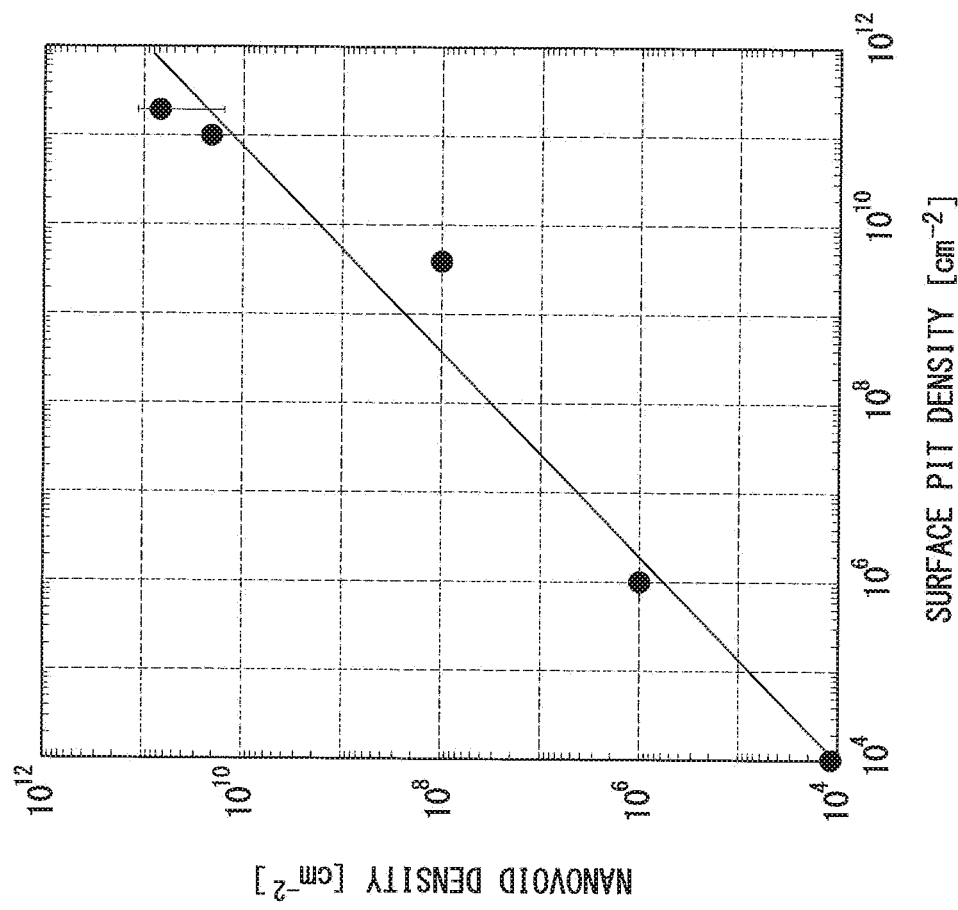
FIG. 2 is a graph showing a relationship between a surface pit density and a nanovoid density in a growth crystal.

FIG. 2 shows the relationship between a surface pit density and a nanovoid density in a growth crystal. As it is obvious from FIG. 2, there is a correlation between a nanovoid density and a surface pit density and they show nearly equivalent values. This is presumably because a nanovoid in a crystal is formed from a pit at a growth surface. Consequently, by measuring a surface pit density with an AFM or an SEM, a nanovoid density in a crystal can be grasped.

For example, a surface pit density of $2.9 \times 10^4$ [cm$^{-2}$] corresponds to the case where one surface pit is recognized in 99 images of 5 μm×7 μm square. It is already known that, when a surface pit exists in device application in particular, an electric field concentrates and a reverse leakage current is affected considerably.

2.4. B Impurity Concentration

Figure 3:
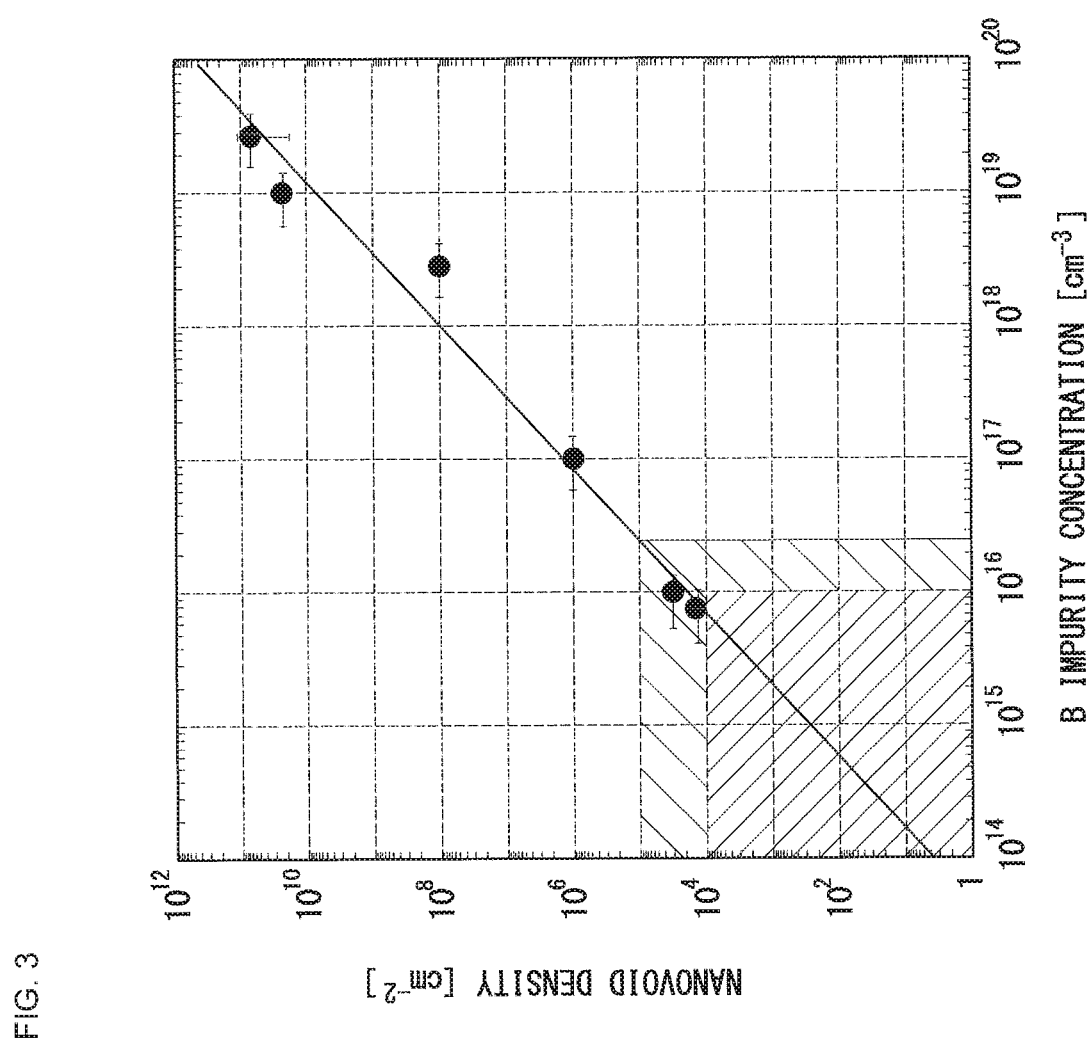
FIG. 3 is a graph showing a relationship between a B impurity concentration and a nanovoid density in a growth crystal.

FIG. 3 shows the relationship between a B impurity concentration and a nanovoid density in a growth crystal.

From FIG. 3, it is obvious that a nanovoid density in a crystal depends on a B impurity concentration. A nanovoid density should be reduced to the least possible extent and is preferably less than $1\times10^5$ [cm$^{-2}$]. It is obvious that, for that purpose, a B impurity concentration may be controlled to $3\times10^{16}$ [cm$^{-3}$] or less and preferably $1\times10^{16}$ [cm$^{-3}$] or less. Further, it is estimated that, if a B impurity concentration can be reduced to about $1\times10^{14}$ [cm$^{-3}$], a crystal in which a nanovoid and a surface pit do not exist can be manufactured.

In order to further clarify a B impurity concentration and the factors of forming a nanovoid and a surface pit described in FIGS. 2 and 3, three-dimensional atom probe measurement was applied to a nanovoid part of a crystal. As a result, segregation of a B impurity was recognized at a place that is thought to be a sidewall of a nanovoid. From the result, it has been clarified that a B impurity relates directly to the formation of a nanovoid.

2.5. Leakage Current Value

Figure 4:
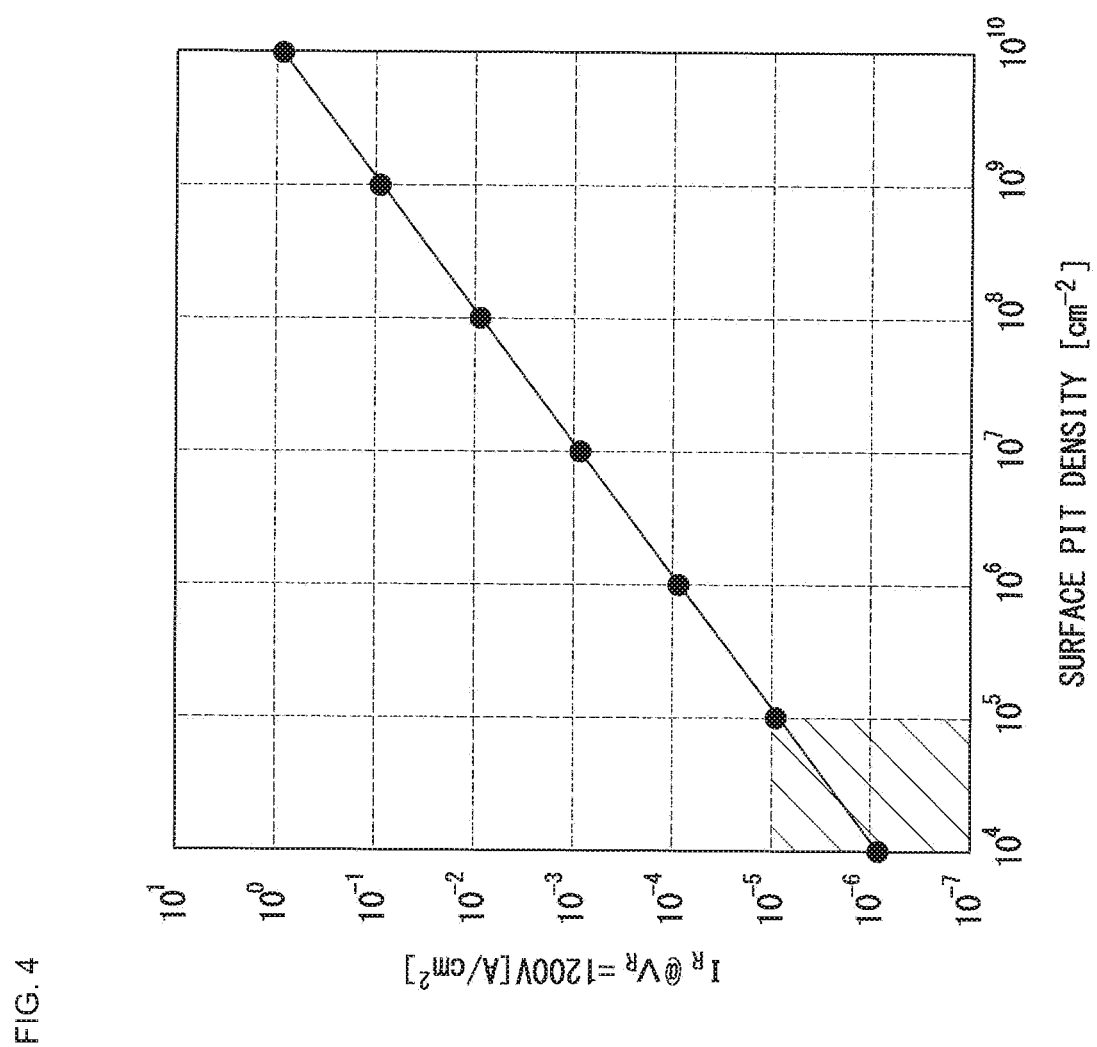
FIG. 4 is a graph showing the dependence of a calculated reverse leakage current $I_R$ (@$V_R$=1,200 V) on a surface pit density in a Schottky barrier diode.

FIG. 4 shows how a leakage current value ($I_R$) changes by a surface pit density when a reverse voltage ($V_R$) of 1,200 V is applied in a Schottky barrier diode. Here, a work function difference φB was set at 1.2 eV, a surface pit depth was set at 15 nm which is a pit depth observed by sectional TEM observation, and a pit angle was set at 84°. An allowable level of a reverse leakage current normally usable in a device is $1\times10^{-5}$ [A/cm$^{-2}$] on the basis of an Si device. From FIG. 4, it is obvious that an allowable surface pit density is less than $1\times10^5$ [cm$^{-2}$].

Although an embodiment according to the present invention has heretofore been explained in detail, the present invention is not limited to the embodiment at all and can be modified variously in the range not departing from the tenor of the present invention.

A gallium nitride crystal and a crystal growth apparatus according to the present invention can be used as a semiconductor material used in an SB diode, a PN diode, a transistor, a power device, an optical device, or the like and an apparatus for manufacturing the semiconductor material.

What is claimed is:

1. A gallium nitride crystal wherein a nanovoid density in the crystal is less than $1\times10^5$ [cm$^2$], wherein a B impurity concentration in the crystal is $3\times10^{16}$ [cm$^3$] or less.

2. The gallium nitride crystal according to claim 1, wherein the nanovoid density is less than $1\times10^4$ [cm 2].

3. The gallium nitride crystal according to claim 1, wherein the B impurity concentration in the crystal is $1\times10^{16}$ [cm$^3$] or less.

4. The gallium nitride crystal according to claim 1, wherein the concentrations of an Na impurity, a K impurity, an Ni impurity, and a Cr impurity in the crystal are $1\times10^{14}$ [cm$^{-3}$] or less, respectively.

5. The gallium nitride crystal according to claim 1, wherein the gallium nitride crystal has been grown under a non-oxidizing atmosphere having a B concentration of less than 1 ppm.

6. A crystal growth apparatus for manufacturing the gallium nitride crystal according to claim 1, wherein the apparatus uses a member having a B concentration of less than 1 ppm at least at a surface part as a member used at a part where a temperature is 500° C. or higher (high-temperature member) among members exposed to a crystal growth space.

7. The crystal growth apparatus according to claim 6, wherein a pBN coated member is not used as the high-temperature member.

8. The crystal growth apparatus according to claim 6, wherein the high-temperature member is a TaC coated member, a TaC bulk member, an SiC coated member, an SiC bulk member, or an uncoated graphite member.

9. The crystal growth apparatus according to claim 6, wherein the apparatus has a growth unit that grows the gallium nitride crystal by a vapor phase epitaxial growth method not using halogen (halogen-free VPE method), a metal organic chemical vapor deposition (MOCVD) method, or a hydride vapor phase epitaxial growth (HVPE) method.

10. The crystal growth apparatus according to claim 9, wherein the apparatus is further configured so that:
(1) the growth unit is a unit that grows the gallium nitride crystal by the halogen-free VPE method;
(2) the growth unit includes:
a crystal growth section having a holder to retain a substrate for growing the gallium nitride crystal over a surface;
a Ga vapor generation section to supply Ga vapor toward the substrate, and
a reaction gas supply unit that supplies a reaction gas, which reacts with the Ga vapor, toward the substrate; and
(3) the Ga vapor generation section includes:
a crucible to retain molten Ga;
an evaporator to accelerate the generation of Ga vapor from the molten Ga in the crucible;
a carrier gas supply unit that feeds a carrier gas to the crucible and supplying the Ga vapor from the crucible toward the substrate; and
a sheath gas supply unit that feeds a sheath gas between the carrier gas and the reaction gas supplied toward the substrate, and inhibiting the reaction gas from intruding into the crucible.

11. A manufacturing method of a gallium nitride crystal for manufacturing the gallium nitride crystal with the crystal growth apparatus according to claim 6.

* * * * *